US010506087B2

(12) United States Patent
Holbery et al.

(10) Patent No.: US 10,506,087 B2
(45) Date of Patent: Dec. 10, 2019

(54) ELECTROACTIVE PERIMETER STIFFENER

(71) Applicant: Microsoft Technology Licensing, LLC, Redmond, WA (US)

(72) Inventors: James D. Holbery, Bellevue, WA (US); Benjamin P. Sullivan, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 140 days.

(21) Appl. No.: 15/886,482

(22) Filed: Feb. 1, 2018

(65) Prior Publication Data

US 2019/0238670 A1     Aug. 1, 2019

(51) Int. Cl.
| | |
|---|---|
| H04M 1/18 | (2006.01) |
| F16F 15/00 | (2006.01) |
| G01P 15/08 | (2006.01) |
| H05K 7/14 | (2006.01) |
| H01H 35/14 | (2006.01) |

(52) U.S. Cl.
CPC ............. *H04M 1/18* (2013.01); *F16F 15/005* (2013.01); *G01P 15/0891* (2013.01); *H01H 35/14* (2013.01); *H05K 7/14* (2013.01); *G06F 2200/1633* (2013.01); *H04M 2250/12* (2013.01)

(58) Field of Classification Search
CPC .... H04M 1/18; H04M 2250/12; F16F 15/005; G01P 15/0891; H01H 35/14; H05K 7/14; G06F 2200/1633

USPC .......................................................... 307/652
See application file for complete search history.

(56) References Cited

U.S. PATENT DOCUMENTS

| | | | |
|---|---|---|---|
| 5,490,411 | A | 2/1996 | Hogan |
| 8,310,458 | B2 | 11/2012 | Faubert et al. |
| 8,869,625 | B2 | 10/2014 | Gutierrez |
| 9,612,622 | B2 | 4/2017 | Moon |
| 2006/0150731 | A1 | 7/2006 | Fontanella et al. |
| 2007/0106483 | A1 | 5/2007 | Kelley et al. |
| 2016/0297073 | A1 | 10/2016 | Whalen-Robinson et al. |

FOREIGN PATENT DOCUMENTS

CN          203119975 U      8/2013

*Primary Examiner* — Hal Kaplan
(74) *Attorney, Agent, or Firm* — Holzer Patel Drennan

(57) ABSTRACT

As mobile computing devices are increasingly expected to be smaller, thinner, and/or lighter, less space is available for incorporating such structurally stiff perimeter components, as well as energy-absorbing components. The electroactive perimeter stiffening devices, systems, and methods described herein detect a free-fall event or condition, anticipate a subsequent impact event, and actively stiffen one or more electroactive perimeter stiffeners of an associated mobile computing device in preparation for the impact event. The electroactive perimeter stiffeners direct impact energy away from, and in some cases, distribute and/or dissipate the impact energy, in an effort to prevent damage to impact-sensitive components of the mobile computing device.

20 Claims, 4 Drawing Sheets

Section A-A

ELECTROACTIVE PERIMETER STIFFENER

BACKGROUND

Mobile computing devices are vulnerable to impact events (e.g., contact with the ground after being inadvertently dropped), which may cause damage to one or more sensitive components thereof. Further, the perimeter of a tablet-shaped device, and particularly the corners of such a device are particularly exposed to contact during an impact event. Still further, the corners of such a device may inadvertently focus the energy of the impact event toward sensitive components of the device, such as a display screen.

Prior mobile computing devices have incorporated structurally stiff perimeter components, such as relatively thick metallic cases and/or supplementary corner stiffeners to receive and direct impact energy away from sensitive components therein. Other computing devices have incorporated energy-absorbing components (e.g., foam) to absorb and dissipate the impact energy. As mobile computing devices are increasingly expected to be smaller, thinner, and/or lighter, less space is available for incorporating such structurally stiff perimeter components, as well as energy-absorbing components.

SUMMARY

Implementations described and claimed herein provide a mobile computing device comprising an impact-sensitive component, a free-fall sensor, and an electroactive structure. The electroactive structure is oriented about a perimeter of the mobile computing device to selectively stiffen in response to a signal from the free-fall sensor and direct energy from an anticipated impact event away from the impact-sensitive component.

Implementations described and claimed herein further provide a method of actively stiffening a perimeter portion of a mobile computing device comprising detecting a free-fall event, applying power to stiffen an electroactive structure oriented about the perimeter portion of the mobile computing device in response to the detected free-fall event, and directing energy from an anticipated impact event away from an impact-sensitive component of the mobile computing device.

Implementations described and claimed herein still further provide a mobile computing device comprising a display screen, an accelerometer, and an electroactive structure. The electroactive structure is oriented in each corner of the mobile computing device to selectively stiffen in response to a signal from the accelerometer and direct energy from an anticipated impact event away from the display screen.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

The electroactive perimeter stiffening devices, systems, and methods described herein detect a free-fall event or condition, anticipate a subsequent impact event, and actively stiffen one or more electroactive perimeter stiffeners of an associated mobile computing device in preparation for the impact event. The electroactive perimeter stiffeners direct impact energy away from, and in some cases, distribute and/or dissipate the impact energy, in an effort to prevent damage to impact-sensitive components of the mobile computing device.

Figure 1:
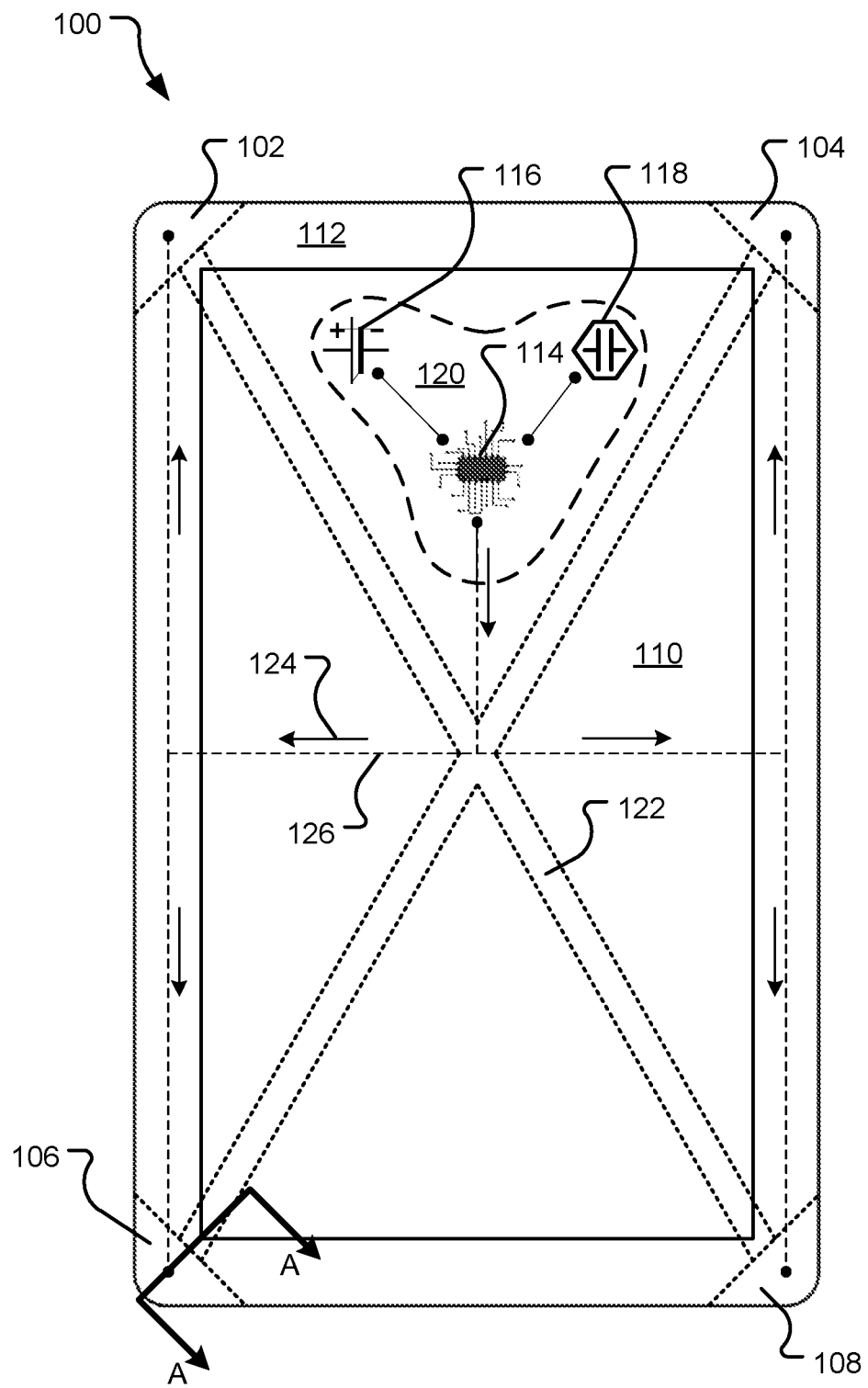
FIG. 1 illustrates a front plan view of an example mobile computing device incorporating electroactive perimeter stiffeners.

FIG. 1 illustrates a front plan view of an example mobile computing device 100 incorporating electroactive perimeter stiffeners 102, 104, 106, 108 (shown in dotted lines as they are hidden from view in FIG. 1). The mobile computing device 100 includes a touchscreen or other display screen 110 that spans a central front-facing surface and a chassis 112 that spans a perimeter front-facing surface and/or a rear-facing surface (not shown) of the mobile computing device 100. The display screen 110, the chassis 112, and/or additional structural components may also occupy side-facing surfaces of the mobile computing device 100, and in combination encompass internal components of the mobile computing device 100.

More specifically, the display screen 110 and the chassis 112 in combination create an enclosure and may serve as protective covers and mounting structures for internal electronic components of the mobile computing device 100, such as an electroactive microprocessor 114, a power source 116, and a free-fall sensor 118. While the electronic components 114, 116, 118 are hidden from view within the mobile computing device 100, window 120 (shown in dashed lines for illustrative purposes) is provided into the mobile computing device 100 to illustrate each of the electronic components 114, 116, 118.

The enclosure formed by the display screen 110 and the chassis 112 may further contain the stiffeners 102, 104, 106, 108, which occupy each of four corners of the chassis 112. While the stiffeners 102, 104, 106, 108 are depicted with roughly triangular shapes in each corner, the stiffeners 102, 104, 106, 108 may take a variety of physical forms, including various sizes and shapes. Further, the mobile computing device 100 may contain a greater or fewer than the depicted four electroactive perimeter stiffeners located in the same or different positions (e.g., corners, side edges, top edges, and bottom edges) about a perimeter of the mobile computing device 100. For example, another mobile computing device may contain an electroactive perimeter stiffener that runs about an entire perimeter of the mobile computing device 100 forming a selectively stiffening frame around the display screen 110. In an example involving a hinged mobile computing device (e.g., a laptop computer), electroactive perimeter stiffeners are located in each of two corners of a display portion opposite the hinge, as those corners are most exposed during a free-fall event or condition. In various implementations, rather than being separate components oriented within the enclosure formed by the display screen 110 and the chassis 112, the stiffeners 102, 104, 106, 108 may form integral portions of the chassis 112 itself.

The stiffeners 102, 104, 106, 108 may also connect to an energy absorbing structure 122 (shown in dotted lines as it is hidden from view in FIG. 1), which receives impact energy from the stiffeners 102, 104, 106, 108 and distributes and/or dissipates the impact energy. While the energy absorbing structure 122 is illustrated as a cross-shaped structure interlinking the stiffeners 102, 104, 106, 108, the energy absorbing structure 122 may possess any physical shape or size capable of distributing and/or dissipating expected impact energy. Further, in other implementations, the energy absorbing structure 122 may not interconnect the stiffeners 102, 104, 106, 108. Still further, while the energy absorbing structure 122 is illustrated in FIG. 1 and described herein as a separate structure, in some implementations, the energy absorbing structure 122 is continuous with and formed of the same electroactive material as the stiffeners 102, 104, 106, 108.

The stiffeners 102, 104, 106, 108 selectively stiffen in response to a detected free-fall event (e.g., a physical drop of the mobile computing device 100) detected by the free-fall sensor 118 in anticipation of an expected subsequent impact event (e.g., contact of the mobile computing device 100 with a ground surface or other hard surface). The stiffeners 102, 104, 106, 108 direct impact energy from the expected impact event away from one or more impact-sensitive components (e.g., the display screen 110) and/or toward the energy absorbing structure 122, where the impact energy is distributed and/or dissipated without damaging the impact-sensitive components of the mobile computing device 100.

The free-fall sensor 118 is any sensor or group of sensors that may be used to detect a free-fall event. In some implementations, the free-fall sensor 118 is an accelerometer, which detects forces on the mobile computing device 100 consistent with acceleration due to the force of gravity. In further implementations, the free-fall sensor 118 may also detect a forced free-fall (e.g., when the mobile computing device 100 is thrown with positive force and then allowed to fall to the ground). Forced free-fall may be detected by correlating a relatively large acceleration (e.g., an acceleration exceeding that caused by the force of gravity immediately subsequently followed by a force consistent with acceleration due to the force of gravity alone).

In further implementations, the free-fall sensor 118 may be a camera that visually detects a tumbling motion of the mobile computing device 100 during a free-fall event, an altimeter that detects a rate of change in elevation of the mobile computing device 100 consistent with a free-fall event, and/or a microphone that is responsive to an audio command by a user that the mobile computing device 100 is in free-fall. For example, the user may speak a "protect device" command while the mobile computing device 100 is in free-fall.

The free-fall sensor 118 is electrically connected to the electroactive microprocessor 114, which receives signal(s) from the free-fall sensor(s) 118 and monitors the signal(s) for a potential free-fall event. The microprocessor 114 may monitor signals from one or more of the aforementioned example free-fall sensing mechanisms, as well as other mechanisms, to detect the free-fall event with a desired accuracy. The microprocessor 114 may also correlate between multiple example mechanisms to provide the desired free-fall detection accuracy.

If a potential free-fall event meets predetermined thresholds defining a free-fall, the microprocessor 114 connects power from the power source 116 (e.g., batteries, capacitors, and power supplies that transform voltage from an external power source) to the stiffeners 102, 104, 106, 108 (as illustrated by small arrows, e.g., arrow 124) via wires and/or traces (e.g., wire 126, shown in dashed lines as it is hidden from view in FIG. 1). In response, the stiffeners 102, 104, 106, 108 stiffen in anticipation of the expected subsequent impact event. In various implementations, the microprocessor 114 may be dedicated for electroactive perimeter stiffening, or shared by performing other functionalities of the mobile computing device 100 as well.

The display screen 110 may be composed of an impact-sensitive glass and/or plastic, which may crack or shatter when subject to the impact energy of the expected impact event. As such, the stiffeners 102, 104, 106, 108 of FIG. 1 may direct impact energy from the expected impact event away from the display screen 110 to prevent damage thereto. The stiffeners 102, 104, 106, 108 may also direct impact energy away from additional or other impact-sensitive components (e.g., camera lenses, disc drive data storage drives, sensing instruments, and microelectronic circuitry) of the mobile computing device 100 to prevent damage to those components as well. Impact-sensitive components as used herein refers to any component of the mobile computing device 100 likely to suffer significant functional damage impairing or disabling its future operability as a result of a free-fall event and subsequent impact event.

The chassis 112 may be made of a variety of materials, including but not limited to metallic alloys (e.g., alloys containing substantial quantities of aluminum or magnesium), rigid polymers (e.g., polyethylene terephthalate (PET) and various polyamides), and reinforced composite structures. In various implementations, the chassis 112 material may be continuous with or distinct from the material of the stiffeners 102, 104, 106, 108. In implementations where the chassis 112 material is distinct from the stiffener material, the connection therebetween may be closely coupled such that impact energy, including vibrations, readily propagate from the chassis to the stiffeners 102, 104, 106, 108 and away from the display screen display screen 110 and/or other impact-sensitive components of the mobile computing device 100.

The stiffeners 102, 104, 106, 108 may be composed of an electroactive polymer (e.g., electro-restrictive polymers, dielectric elastomers, ferroelectric polymers, electro-restrictive graft polymers, liquid crystalline polymers, electrorheological fluids, ferrofluids, magneto-resistive fluids, ionic polymer-metal composites, and stimuli-responsive gels) or other electroactive material that substantially increases its modulus of elasticity in response to an applied electric field. For further example, the stiffeners 102, 104, 106, 108 may be composed of a set of parallel plate conductors and dielectric thin films oriented therebetween. Application of power to the parallel plate conductors cause an increase in laminar friction between the dielectric thin films, which selectively increases overall rigidity of the structure.

For further example, the stiffeners 102, 104, 106, 108 may be composed of composite materials that includes an electroactive polymer as a constituent component of the whole stiffener composition (e.g., the electroactive polymer combined with layers of fibrous material, metal alloys, and/or non-electroactive plastics). For electroactive materials that are fluidic (or gelled) in a normal state composition, the chassis 112 may also incorporate one or more fluid-tight reservoirs to contain the fluidic or gelatinous stiffeners 102, 104, 106, 108.

The energy absorbing structure 122 may be composed of the same electroactive material as the stiffeners 102, 104, 106, 108, or of a different material specifically adapted to distribute and/or dissipate the impact energy. For example, the energy absorbing structure 122 may be composed of a readily plastically or elastically deformable material (e.g., polyurethane, polyether, polyethylene, and expanded polystyrene). In some implementations, the energy absorbing structure 122 is a thin film attached to or continuous with the stiffeners 102, 104, 106, 108. The energy absorbing structure 122 may dampen vibrations caused by the impact event as the vibrations propagate through the energy absorbing structure 122.

Additional internal structural and/or electronic components (e.g., structural framework, printed circuit boards, microprocessors, integrated circuits, electronic storage devices, cooling components, cameras, antennae, speakers, microphones, power supplies, and batteries, not shown) may also be mounted within the enclosure formed by the display screen 110 and the chassis 112.

In various implementations, the mobile computing device 100 is a tablet computer, laptop computer, personal computer, gaming device, smart phone, or any other discrete mobile device that carries out one or more specific sets of arithmetic and/or logical operations. In some instances, the mobile computing device 100 is hingedly attached to and/or removable from a keyboard portion (not shown). The mobile computing device 100 may also be sealed within a fabric covering (not shown) that serves to protect the internal electronic components from contaminates and hide seams between the various components of the mobile computing device 100.

Figure 2:
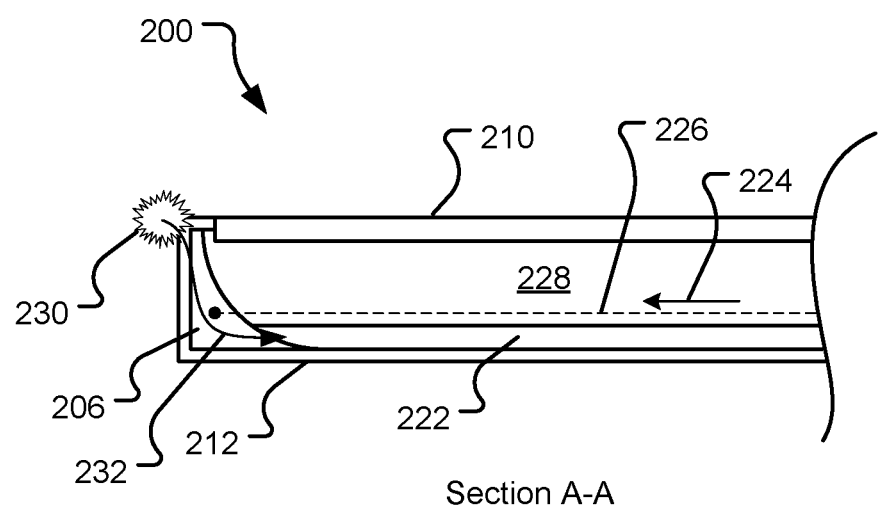
FIG. 2 illustrates a sectional view A-A of the example mobile computing device incorporating the electroactive perimeter stiffeners of FIG. 1.

FIG. 2 illustrates a sectional view A-A of the example mobile computing device 100 of FIG. 1. Mobile computing device 200 includes a touchscreen or other display screen 210 that spans a central front-facing surface and a chassis 212 that spans a perimeter front-facing surface, side facing surfaces, and a rear-facing surface (not shown) of the mobile computing device 200. The display screen 210, the chassis 212, and/or additional structural components in combination encompass internal components of the mobile computing device 200.

More specifically, the display screen 210 and the chassis 212 in combination create an enclosure 228 and may serve as protective covers and mounting structures for various internal electronic components of the mobile computing device 200, such as an electroactive microprocessor, a power source, and a free-fall sensor (not shown, see e.g., components 114, 116, 118 of FIG. 1). The enclosure 228 formed by the display screen 210 and the chassis 212 may further contain electroactive perimeter stiffeners (e.g., stiffener 206), each of which occupy a portion of the perimeter (e.g., a corner) of the chassis 212. The stiffeners may also connect to an energy absorbing structure 222, which receives impact energy from the stiffeners and distributes and/or dissipates the impact energy.

The stiffeners selectively stiffen in response to a detected free-fall event in anticipation of an expected subsequent impact event. The stiffeners direct impact energy from the expected impact event away from one or more impact-sensitive components (e.g., the display screen 210) and/or toward the energy absorbing structure 222, where the impact energy is distributed and/or dissipated without damaging the impact-sensitive components of the mobile computing device 200. More specifically, if a potential free-fall event meets predetermined thresholds defining a free-fall, the microprocessor connects power from the power source to the stiffeners (as illustrated by arrow 224) via wires and/or traces (e.g., wire 226). In response, the stiffeners stiffen in anticipation of the expected subsequent impact event.

The display screen 210 may be composed of an impact-sensitive glass and/or plastic, which may crack or shatter when subject to the impact energy of the expected impact event. As such, the stiffener 206 may direct impact energy from the expected impact event away from the display screen 210 to prevent damage to the display screen 210. As such, the stiffener 206 is physically biased toward the rear-facing surface and away from the front-facing surface of the mobile computing device 200 (which contains the display screen 210). Further, the energy absorbing structure 222 extends away from the stiffener 206 within the enclosure 228 adjacent the chassis 212 and spaced apart from the display screen 210. For example, impact 230 occurs at a corner of the chassis 212 near the display screen 210. The physical bias of the stiffener 206 directs the impact energy through the stiffener 206 away from the display screen 210 and into the energy absorbing structure 222, as illustrated by arrow 232.

Figure 3:
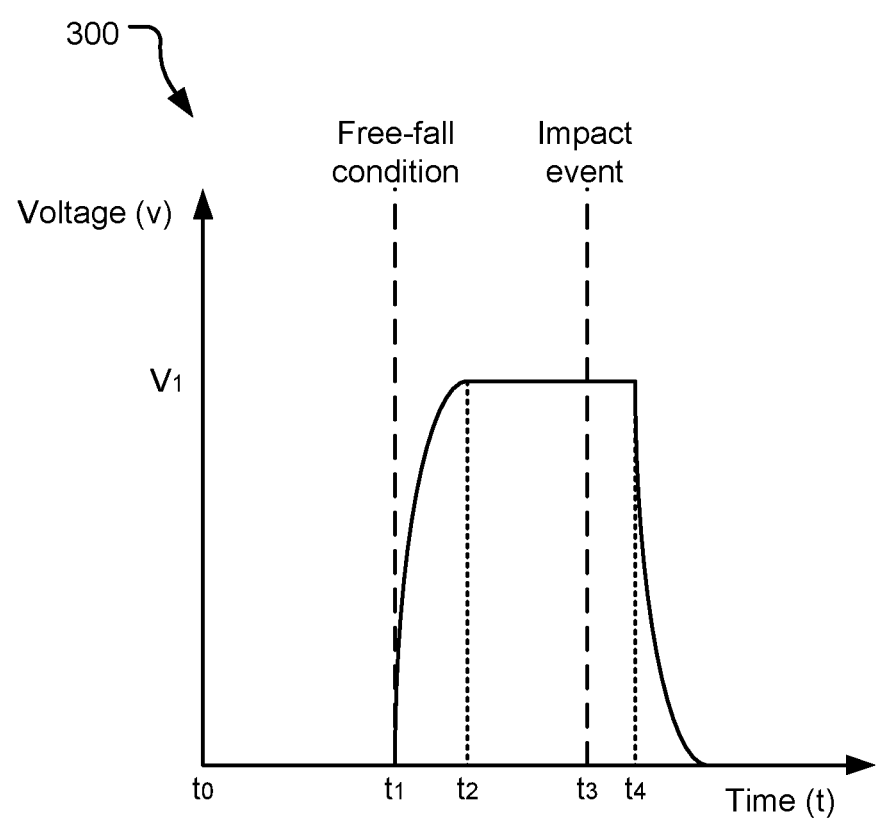
FIG. 3 illustrates an example voltage over time performance curve of an electroactive perimeter stiffening system.

FIG. 3 illustrates an example voltage over time performance curve 300 of an electroactive perimeter stiffening system. The performance curve 300 plots voltage applied to one or more electroactive structures oriented about a perimeter of a mobile computing device to selectively stiffen in response to a signal from one or more free-fall sensors. During normal operating conditions of the mobile computing device (e.g., between times $t_0$ and $t_1$), no voltage is applied to the electroactive structures. At time $t_1$, a signal from the free-fall sensor(s) indicates a detected free-fall condition of the mobile computing device.

Upon detection of the free-fall condition, the electroactive perimeter stiffening system triggers a power source within the mobile computing device to apply power to the electroactive structures, thereby stiffening them. The applied voltage rapidly ramps up to $V_1$, reached at $t_2$. An anticipated or detected impact event occurs at $t_3$. To the extent that the impact event is detected by the free-fall sensors, a predetermined period passes and if the free-fall sensors indicate that the mobile computing device is no longer in a free-fall condition, at $t_4$ the applied voltage is disconnected from the electroactive structures. In some implementations, the predetermined period is omitted and the applied voltage is disconnected as soon as the impact event is detected.

In still further implementations, a variable voltage profile is applied to the electroactive structures responsive to detection of the impact event. The variable voltage profile may vary stiffness of the electroactive structures in a manner intended to both withstand the forces of the impact event initially (e.g., apply a high voltage to the electroactive structures) and dampen or distribute the forces of the impact event immediately after impact (e.g., apply a low or oscillating voltage to the electroactive structures).

To the extent the impact event is not detected by the free-fall sensors, the voltage applied to the electroactive structures remains at $V_1$ until a predetermined time period passes or the power supply is exhausted. The total quantity of time that the electroactive structures remain selectively stiffened responsive to the applied voltage $V_1$ (approximately $t_1$-$t_4$) may range from one to ten seconds, for example.

Figure 4:
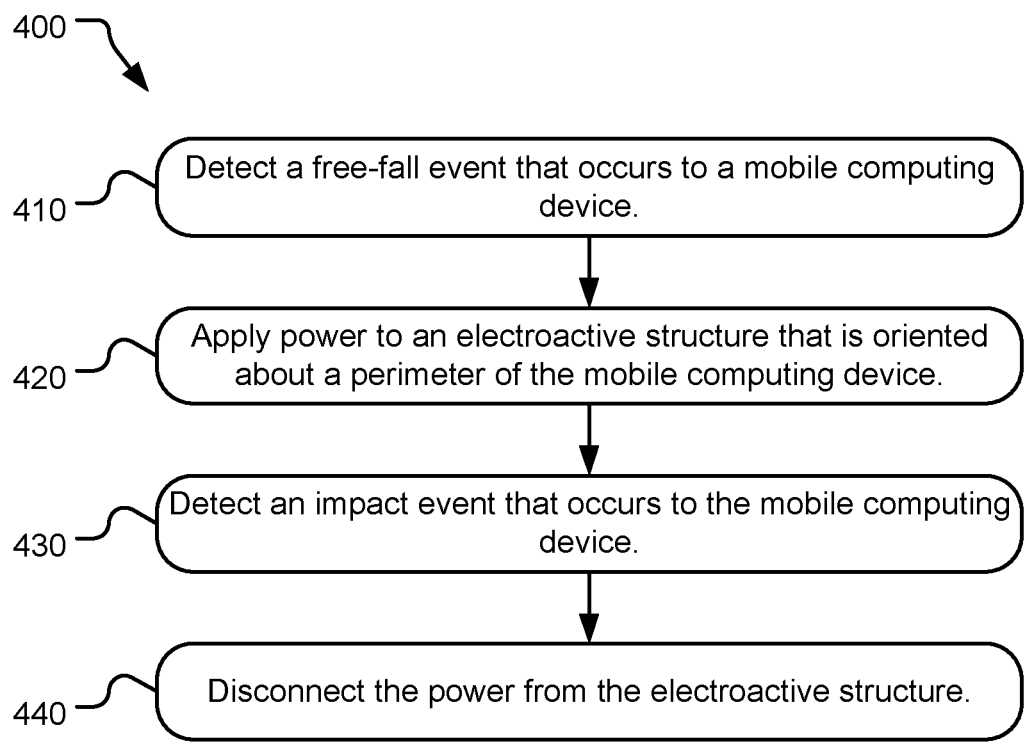
FIG. 4 illustrates example operations for stiffening a perimeter portion of a mobile computing device in response to a detected drop event.

FIG. 4 illustrates example operations 400 for stiffening a perimeter portion of a mobile computing device in response to a detected drop event. A first detecting operation 410 detects a free-fall event or condition that occurs to the mobile computing device (e.g., the device is dropped or thrown by a user). In various implementations, one or more free-fall sensors monitor the mobile computing device and its surroundings to determine if and when the free-fall event takes place.

In response to the first detecting operation 410, an applying operation 420 applies power to electroactive structures that are oriented about one or more portions of a perimeter of the mobile computing device (e.g., one or more corners and/or side edges of the mobile computing device). In various implementations, the applying operation 420 connects power from one or more power sources within the mobile computing device (e.g., a battery or batteries) to the electroactive structures. The power applied to the electroactive structures causes their modulus of elasticity to substantially increase (e.g., up to 3x), which allows the electroactive structures to withstand an anticipated impact event without substantial deformation, while directing energy from the impact event away from impact-sensitive component(s) of the mobile computing device (e.g., the display screen). In various implementations, the applying operation 420 may partially or completely deplete the power source(s) within the mobile computing device.

A second detecting operation 430 detects an impact event that occurs to the mobile computing device (e.g., the device impacts the ground or other surface). In various implementations, the free-fall sensors continue to monitor the mobile computing device during the detected free-fall event to determine if and when the impact event takes place. The stiffened electroactive structures direct impact energy from the impact event away from, and in some cases distribute and/or dissipate the impact energy, in an effort to prevent damage to the impact-sensitive components of the mobile computing device.

In response to the second detecting operation 430, a disconnecting operation 440 disconnects the applied power from the electroactive structures, which relaxes the electroactive structures (or reduces their relative stiffness). In various implementations, the applied power is disconnected entirely immediately upon detecting the impact event, or after a predetermined period to permit the impact energy to propagate through the electroactive structures. In other implementations, the applied power is reduced before being disconnected entirely following the detected the impact event. This may permit the electroactive structures to distribute and/or dissipate the impact energy, as well as direct the impact energy away from the impact-sensitive components of the mobile computing device. In various implementations, a power curve to be applied to the electroactive structures is pre-defined to maximize the effectiveness of the electroactive structures in directing, distributing, and/or dissipating the impact energy.

The operations making up the embodiments of the invention described herein are referred to variously as operations, steps, objects, or modules. Furthermore, the operations may be performed in any order, adding or omitting operations as desired, unless explicitly claimed otherwise or a specific order is inherently necessitated by the claim language.

An example mobile computing device according to the presently disclosed technology includes an impact-sensitive component, a free-fall sensor to detect a free-fall condition of the mobile computing device, and an electroactive structure oriented about a perimeter of the mobile computing device. The electroactive structure selectively stiffens responsive to the detected free-fall condition and directs energy from an anticipated impact event away from the impact-sensitive component.

Another example mobile computing device according to the presently disclosed technology further includes an energy absorbing structure connected to the electroactive structure. The electroactive structure directs the energy from the anticipated impact event to the energy absorbing structure where it is one or both of distributed and dissipated.

In another example mobile computing device according to the presently disclosed technology, the energy absorbing structure is continuous with the electroactive structure.

In another example mobile computing device according to the presently disclosed technology, the electroactive structure is oriented in at least one corner of the mobile computing device.

In another example mobile computing device according to the presently disclosed technology, the electroactive structure is oriented in each of four corners of the mobile computing device.

In another example mobile computing device according to the presently disclosed technology, the electroactive structure is incorporated into a chassis of the mobile computing device.

In another example mobile computing device according to the presently disclosed technology, the electroactive structure is oriented inside a chassis of the mobile computing device.

Another example mobile computing device according to the presently disclosed technology further includes a power supply to deliver power to the electroactive structure in response to the detected free-fall condition.

In another example mobile computing device according to the presently disclosed technology, the free-fall sensor is further configured to detect the anticipated impact event.

In another example mobile computing device according to the presently disclosed technology, the electroactive structure includes an electroactive polymer.

An example method of actively stiffening a perimeter portion of a mobile computing device according to the presently disclosed technology includes detecting a free-fall condition of the mobile computing device, applying power to stiffen an electroactive structure oriented about the perimeter portion of the mobile computing device in response to the detected free-fall condition, and directing energy from an anticipated impact event away from an impact-sensitive component of the mobile computing device.

Another example method of actively stiffening a perimeter portion of a mobile computing device according to the presently disclosed technology further includes absorbing the energy from the anticipated impact event at an energy absorbing structure connected to the electroactive structure.

In another example method of actively stiffening a perimeter portion of a mobile computing device according to the presently disclosed technology, the electroactive structure is oriented in at least one corner of the mobile computing device.

In another example method of actively stiffening a perimeter portion of a mobile computing device according to the presently disclosed technology, the electroactive structure is oriented in each of four corners of the mobile computing device.

In another example method of actively stiffening a perimeter portion of a mobile computing device according to the presently disclosed technology, the electroactive structure is incorporated into a chassis of the mobile computing device.

In another example method of actively stiffening a perimeter portion of a mobile computing device according to the presently disclosed technology, the electroactive structure is oriented inside a chassis of the mobile computing device.

In another example method of actively stiffening a perimeter portion of a mobile computing device according to the presently disclosed technology, the stiffening the electroactive structure includes powering the electroactive structure from a power supply within the mobile computing device.

Another example method of actively stiffening a perimeter portion of a mobile computing device according to the presently disclosed technology further includes detecting the anticipated impact event and relaxing the electroactive structure responsive to detecting the anticipated impact event.

In another example method of actively stiffening a perimeter portion of a mobile computing device according to the presently disclosed technology, the electroactive structure includes an electroactive polymer.

An example mobile computing device according to the presently disclosed technology includes a display screen, an accelerometer to detect a free-fall condition of the mobile computing device, and an electroactive structure oriented in each corner of the mobile computing device. The electroactive structure selectively stiffens responsive to the detected free-fall condition and directs energy from an anticipated impact event away from the display screen.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A mobile computing device comprising:
    an impact-sensitive component;
    a free-fall sensor to detect a free-fall condition of the mobile computing device; and
    an electroactive structure oriented about a perimeter of the mobile computing device to selectively stiffen responsive to the detected free-fall condition and to direct energy from an anticipated impact event away from the impact-sensitive component.

2. The mobile computing device of claim 1, further comprising:
    an energy absorbing structure connected to the electroactive structure, the electroactive structure to direct the energy from the anticipated impact event to the energy absorbing structure where it is one or both of distributed and dissipated.

3. The mobile computing device of claim 2, wherein the energy absorbing structure is continuous with the electroactive structure.

4. The mobile computing device of claim 1, wherein the electroactive structure is oriented in at least one corner of the mobile computing device.

5. The mobile computing device of claim 1, wherein the electroactive structure is oriented in each of four corners of the mobile computing device.

6. The mobile computing device of claim 1, wherein the electroactive structure is incorporated into a chassis of the mobile computing device.

7. The mobile computing device of claim 1, wherein the electroactive structure is oriented inside a chassis of the mobile computing device.

8. The mobile computing device of claim 1, further comprising:
    a power supply to deliver power to the electroactive structure in response to the detected free-fall condition.

9. The mobile computing device of claim 1, wherein the free-fall sensor is further configured to detect the anticipated impact event.

10. The mobile computing device of claim 1, wherein the electroactive structure includes an electroactive polymer.

11. A method of actively stiffening a perimeter portion of a mobile computing device comprising:
    detecting a free-fall condition of the mobile computing device;
    applying power to stiffen an electroactive structure oriented about the perimeter portion of the mobile computing device in response to the detected free-fall condition; and
    directing energy from an anticipated impact event away from an impact-sensitive component of the mobile computing device.

12. The method of claim 11, further comprising:
    absorbing the energy from the anticipated impact event at an energy absorbing structure connected to the electroactive structure.

13. The method of claim 11, wherein the electroactive structure is oriented in at least one corner of the mobile computing device.

14. The method of claim 11, wherein the electroactive structure is oriented in each of four corners of the mobile computing device.

15. The method of claim 11, wherein the electroactive structure is incorporated into a chassis of the mobile computing device.

16. The method of claim 11, wherein the electroactive structure is oriented inside a chassis of the mobile computing device.

17. The method of claim 11, wherein the stiffening the electroactive structure includes powering the electroactive structure from a power supply within the mobile computing device.

18. The method of claim 11, further comprising:
    detecting the anticipated impact event; and
    relaxing the electroactive structure responsive to detecting the anticipated impact event.

19. The method of claim 11, wherein the electroactive structure includes an electroactive polymer.

20. A mobile computing device comprising:
    a display screen;
    an accelerometer to detect a free-fall condition of the mobile computing device; and
    an electroactive structure oriented in each corner of the mobile computing device to selectively stiffen responsive to the detected free-fall condition and to direct energy from an anticipated impact event away from the display screen.

* * * * *